(12) United States Patent
Taft

(10) Patent No.: US 8,103,467 B2
(45) Date of Patent: Jan. 24, 2012

(54) DETERMINATION OF DISTRIBUTION TRANSFORMER VOLTAGES BASED ON METERED LOADS

(75) Inventor: Jeffrey D. Taft, Canonsburg, PA (US)

(73) Assignee: Accenture Global Services Limited, Dublin (IE)

( * ) Notice: Subject to any disclaimer, the term of this patent is extended or adjusted under 35 U.S.C. 154(b) by 456 days.

(21) Appl. No.: 12/353,836

(22) Filed: Jan. 14, 2009

(65) Prior Publication Data

US 2010/0179780 A1    Jul. 15, 2010

(51) Int. Cl.
    G06F 19/00    (2011.01)
    H02M 3/335   (2006.01)

(52) U.S. Cl. ............................................. 702/64; 363/24

(58) Field of Classification Search .................. 702/64, 702/57; 324/72, 74; 363/24, 20
    See application file for complete search history.

(56) References Cited

U.S. PATENT DOCUMENTS

| | | | | |
|---|---|---|---|---|
| 5,455,776 | A | 10/1995 | Novosel | 364/492 |
| 6,456,061 | B1 * | 9/2002 | Criniti et al. | 324/127 |
| 6,845,333 | B2 | 1/2005 | Anderson et al. | 702/65 |
| 7,009,855 | B2 * | 3/2006 | Mueller | 363/24 |
| 7,096,175 | B2 | 8/2006 | Rehtanz et al. | 703/18 |
| 7,107,162 | B2 | 9/2006 | Zima et al. | 702/65 |
| 7,200,500 | B2 | 4/2007 | Larsson et al. | 702/64 |
| 7,283,915 | B2 | 10/2007 | Saha et al. | 702/59 |
| 2003/0169029 | A1 | 9/2003 | Piesinger | 324/66 |
| 2004/0263147 | A1 | 12/2004 | Piesinger | 324/86 |
| 2005/0160128 | A1 | 7/2005 | Fardanesh | 708/446 |
| 2006/0224336 | A1 | 10/2006 | Petras et al. | 702/62 |
| 2006/0247874 | A1 | 11/2006 | Premerlani et al. | 702/64 |
| 2006/0259255 | A1 | 11/2006 | Anderson et al. | 702/64 |
| 2007/0024231 | A1 * | 2/2007 | Lee et al. | 318/802 |
| 2007/0086134 | A1 | 4/2007 | Zweigle et al. | 361/85 |
| 2008/0071482 | A1 | 3/2008 | Zweigle et al. | 702/62 |
| 2008/0150544 | A1 | 6/2008 | Premerlani et al. | 324/521 |

(Continued)

FOREIGN PATENT DOCUMENTS

EP    1 324 455 A1    7/2003

(Continued)

OTHER PUBLICATIONS

Jiang, Weiqing et al., A Distributed State Estimator Utilizing Synchronized Phasor Measurements, May 2007, pp. 563-571, vol. 22, No. 2, IEEE Transactions on Power Systems.

(Continued)

*Primary Examiner* — Bryan Bui
(74) *Attorney, Agent, or Firm* — Nathan O. Greene; Brinks Hofer Gilson & Lione

(57) ABSTRACT

A method for determining a primary side voltage of a distribution transformer includes determining a first current and a second current flowing through a secondary winding of the transformer at a plurality of time instants based on current meter data generated by a plurality of metered loads. The method may include determining a total current flowing to the plurality of metered loads for each of the plurality of time instants based on the first current and the second current. The method includes receiving a respective meter voltage from each of the plurality of metered loads at each of the plurality of time instants. The method includes determining a secondary side voltage of the transformer at each of the plurality of time instants based on the first, second, and total current and the respective meter voltages. The method includes determining the primary side voltage based on the secondary side voltage.

21 Claims, 9 Drawing Sheets

U.S. PATENT DOCUMENTS

| | | | |
|---|---|---|---|
| 2008/0189061 A1 | 8/2008 | Scholtz et al. | 702/65 |
| 2009/0088989 A1* | 4/2009 | Guzman-Casillas | 702/58 |
| 2010/0179779 A1 | 7/2010 | Taft | 702/64 |

FOREIGN PATENT DOCUMENTS

| | | |
|---|---|---|
| EP | 1 780 858 A1 | 5/2007 |
| WO | WO 00/48284 | 8/2000 |
| WO | WO 03/079512 A2 | 9/2003 |

OTHER PUBLICATIONS

Hojo, Masahide et al., Analysis of Load Frequency Control Dynamics Based on Multiple Synchronized Phasor Measurements, Aug. 22-26, 2005, pp. 1-7, 15$^{th}$ PSCC Leige.

Zima, Marek et al., Design Aspects for Wide-Area Monitoring and Control Systems, May 2005, pp. 980-996, vol. 93, No. 5, IEEE.

Overholt, Phil, DOE Update NASPI Working Group, Mar. 6, 2008, pp. 1-7, North American Electric Reliability Corporation, New Orleans, Louisiana.

Begovic, Miroslav et al., Issues Related to the Implementation of Synchrophasor Measurements, 2008, pp. 1-10, Proceedings of the 41$^{st}$ Hawaii International Conference on System Sciences.

Zhao, Liang et al., Multiarea State Estimation Using Synchronized Phasor Measurements, May 2005, pp. 611-617, vol. 20, No. 2, IEEE Transactions on Power Systems.

N60 Network Stability and Synchrophasor Measurement System, Aug. 20, 2008, pp. 1-2, available at http://www.geindustrial.com.

Synchrophasor Voltage Angle Measurement Real-Time Updates/Synchrophasor-Equipped Devices Report Power System Information From Around the World, Aug. 20, 2008, pp. 1-21, Schweitzer Engineering Laboratories, Inc., available at http://www.synchrophasors.com.

European Search Report, dated Jun. 10, 2010, pp. 1-3, European Patent Office, The Netherlands.

Zhou, Ming et al., A Preprocessing Method for Effective PMU Placement Studies, Apr. 2008, pp. 2862-2867, IEEE.

Martin, K. E. et al., Exploring the IEEE Standard C37.118-2005 Synchrophasors for Power Systems, Oct. 2008, pp. 1805-1811, vol. 23, No. 4, IEEE Transactions on Power Delivery.

Larsson, Mats et al., Interactive Simulation and Visualization of Wide-Area Monitoring and Control Applications, pp. 1-6, ABB Switzerland Ltd., retrieved Jun. 3, 2011, from http://www.dii.unisi.it/hybrid/cc/publications/2004/papers/lar04d.pdf (2005).

Larsson, Mats et al., Real-Time Voltage Stability Assessment of Transmission Corridors, pp. 1-6, ABB Switzerland Ltd., retrieved Jun. 6, 2011, from http://www.dii.unisi.it/hybrid/cc/publications/2003/iifacpps2003.pdf (2003.).

Ballance, John et al., Use of Synchronized Phasor Measurement System for Enhancing AC-DC Power System Transmission Reliability and Capability, pp. 1-12, Southern California Edison Co. , retrieved Jun. 6, 2011, from http://www.naspi.org/resources/archive/olatt/pmu_acdc_paper_doe.pdf (Sep. 2004).

* cited by examiner $$T = T \cdot T = \begin{bmatrix} A^2+BC & 2AB \\ 2AC & A^2+BC \end{bmatrix}$$

$$T^2 = \begin{bmatrix} X & Y \\ W & X \end{bmatrix}$$

$A^4 - XA^2 + WY/4 = 0$
$B = Y/(2A)$
$C = W/(2/A)$

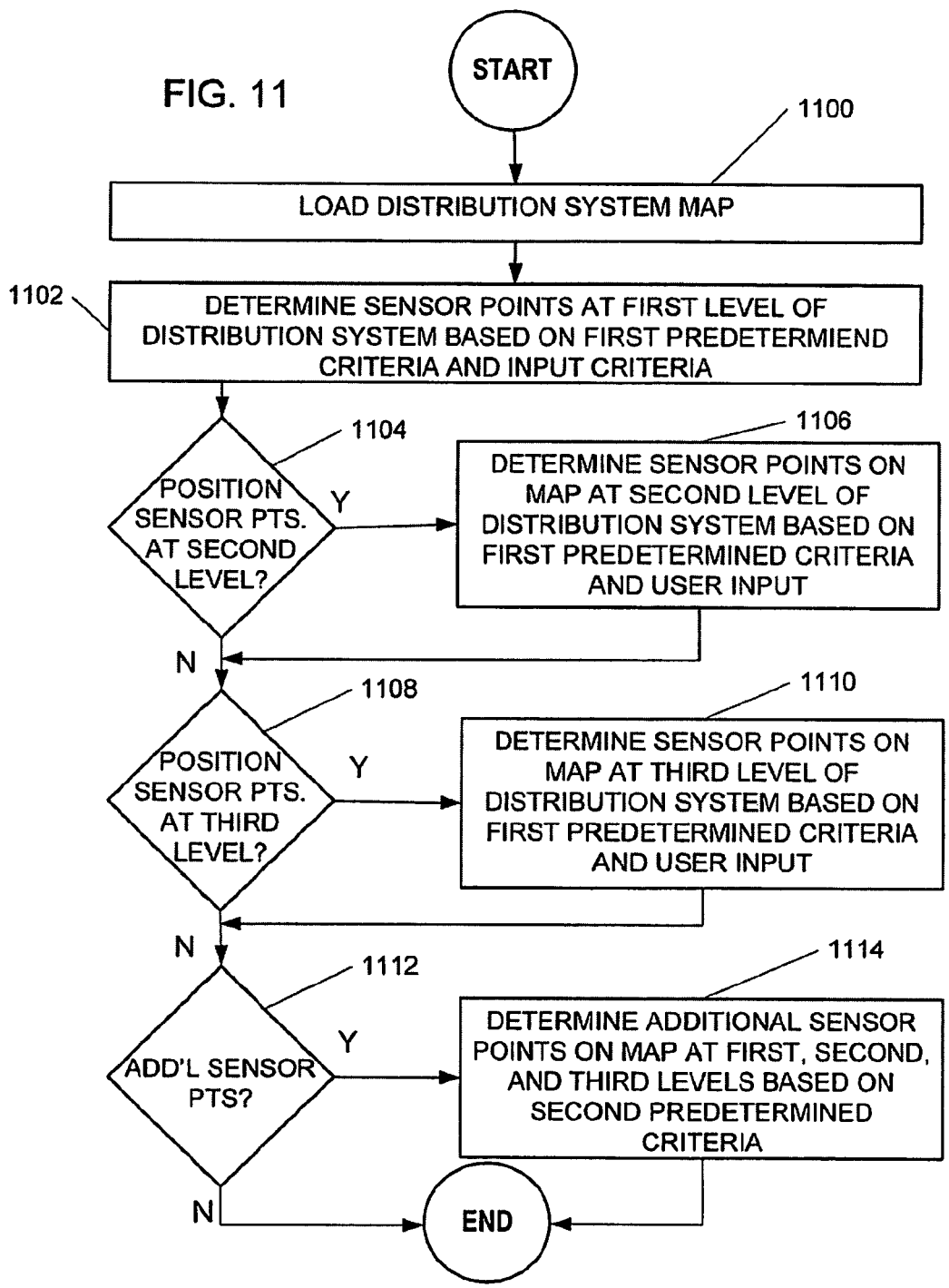

DETERMINATION OF DISTRIBUTION TRANSFORMER VOLTAGES BASED ON METERED LOADS

RELATED APPLICATION

The following commonly-owned U.S. utility patent application is related to this application and is incorporated by reference herein: U.S. patent application Ser. No. 12/353,413 entitled "DISTRIBUTION SYSTEM ANALYSIS USING METER DATA".

BACKGROUND

1. Technical Field

This application relates to determining electrical distribution transformer voltages and, in particular, determining distribution transformer voltages based on metered loads.

2. Related Art

Distribution system customer meters are used to measure power consumption by a customer for purposes of billing the customer. Customer meters have become more sophisticated over the course of time. The meters may be digital allowing data to be used for distribution system analysis. The meters can provide instantaneous data related to a connected distribution transformer. Each meter can be accessed from a remote location allowing the data to be monitored and/or retrieved.

SUMMARY

A method of determining a primary side voltage of a distribution transformer may include determining a first current flowing through a secondary winding of the distribution transformer at a plurality of time instants. The determination of the first current may be based on current meter data generated by a plurality of metered loads connected to a secondary side of the distribution transformer. The method may include determining a second current flowing through the secondary winding of the distribution transformer at the plurality of time instants. The determination of the second current is based on current meter data generated by the plurality of metered loads connected to the secondary side of the distribution transformer.

The method may include determining a total current flowing to the plurality of metered loads for each of the plurality of time instants based on the first current at the plurality of time instants and the second current at the plurality of time instants. The method may include receiving a respective meter voltage from each of the plurality of metered loads at each of the plurality of time instants. The method may include determining a secondary side voltage of the distribution transformer at each of the plurality of time instants based on the first current, the second current, the total current, and the respective meter voltages at the plurality of time instants. The method may include determining the primary side voltage based on the secondary side voltage determined at one of the plurality of time instants.

In one example, the plurality of time instants may be a first time instant, a second time instant, and a third time instant. In another example, the respective meter voltage from each of the plurality of metered loads at each of the plurality of time instants may be a respective meter voltage from a first meter and a second meter at each of the plurality of time instants. In another example, the method may include determining the secondary side voltage of the distribution transformer at each of the plurality of time instants based on respective service line drop losses. In another example, the method may include determining the secondary side voltage of the distribution transformer at each of the plurality of time instants based on common line losses.

A system to determine a primary side voltage of a distribution transformer may include a processor configured to determine a first current flowing through a secondary winding of a distribution transformer at a plurality of time instants based on current meter data generated by a plurality of metered loads connected to the secondary side of the distribution transformer. The processor may be configured to determine a second current flowing through the secondary winding of a distribution transformer at the plurality of time instants based on current meter data generated by the plurality of metered loads connected to the secondary side of the distribution transformer.

The processor may be configured to determine a total current flowing to the plurality of metered loads for each of the plurality of time instants based on the first current at the plurality of time instants and the second current at the plurality of time instants. The processor may be configured to receive a respective meter voltage from each of the plurality of metered loads at each of the plurality of time instants. The processor may be configured to determine a secondary side voltage of the distribution transformer at each of the plurality of time instants based on the first current, the second current, the total current, and the respective meter voltages at the plurality of time instants. The processor may be configured to determine the primary side voltage based on the secondary side voltage determined at one of the plurality of time instants.

In one example, the plurality of time instants may be a first time instant, a second time instant, and a third time instant. In another example, the respective meter voltage from each of the plurality of metered loads at each of the plurality of time instants may be a respective meter voltage from a first meter and a second meter at each of the plurality of time instants. In another example, the processor may be further configured to determine the secondary side voltage of the distribution transformer at each of the plurality of time instants based on respective service line drop losses. In another example, the processor may be further configured to determine the secondary side voltage of the distribution transformer at each of the plurality of time instants based on common line losses.

A computer-readable medium encoded with computer executable instructions that are executable with a processor may include instructions executable to determine a first current flowing through a secondary winding of a distribution transformer at a plurality of time instants based on current meter data generated by a plurality of metered loads connected to a secondary side of the distribution transformer. The computer-readable medium may include instructions executable to determine a second current flowing through the secondary winding of the distribution transformer at the plurality of time instants based on current meter data generated by the plurality of metered loads connected to the secondary side of the distribution transformer.

The computer-readable medium may include instructions executable to determine a total current flowing to the plurality of metered loads for each of the plurality of time instants based on the first current at the plurality of time instants and the second current at the plurality of time instants. The computer-readable medium may include instructions executable to receive a respective meter voltage from each of the plurality of metered loads at each of the plurality of time instants. The computer-readable medium may include instructions executable to determine a secondary side voltage of the distribution transformer at each of the plurality of time instants based on the first current, the second current, the total current, and the respective meter voltages at the plurality of time instants. The computer-readable medium may include instructions executable to determine a primary side voltage of the distribution transformer based on the secondary side voltage determined at one of the plurality of time instants.

In one example, the plurality of time instants may be a first time instant, a second time instant, and a third time instant. In another example, the respective meter voltage from each of the plurality of metered loads at each of the plurality of time instants may be a respective meter voltage from a first meter and a second meter at each of the plurality of time instants. In another example, the computer-readable medium may include instructions executable to determine the secondary side voltage of the distribution transformer at each of the plurality of time instants based on respective service line drop losses. In another example, the computer-readable medium may include instructions executable to determine the secondary side voltage of the distribution transformer at each of the plurality of time instants based on common line losses.

Further objects and advantages of the present invention will be apparent from the following description, reference being made to the accompanying drawings wherein preferred embodiments of the present invention are clearly shown.

BRIEF DESCRIPTION OF THE DRAWINGS

The innovation may be better understood with reference to the following drawings and description. The components in the figures are not necessarily to scale, emphasis instead being placed upon illustrating the principles of the invention. Moreover, in the figures, like-referenced numerals designate corresponding parts throughout the different views.

FIG. 11 is a flow diagram of an example operation to determine sensor points in a distribution system.

DETAILED DESCRIPTION

Figure 1:
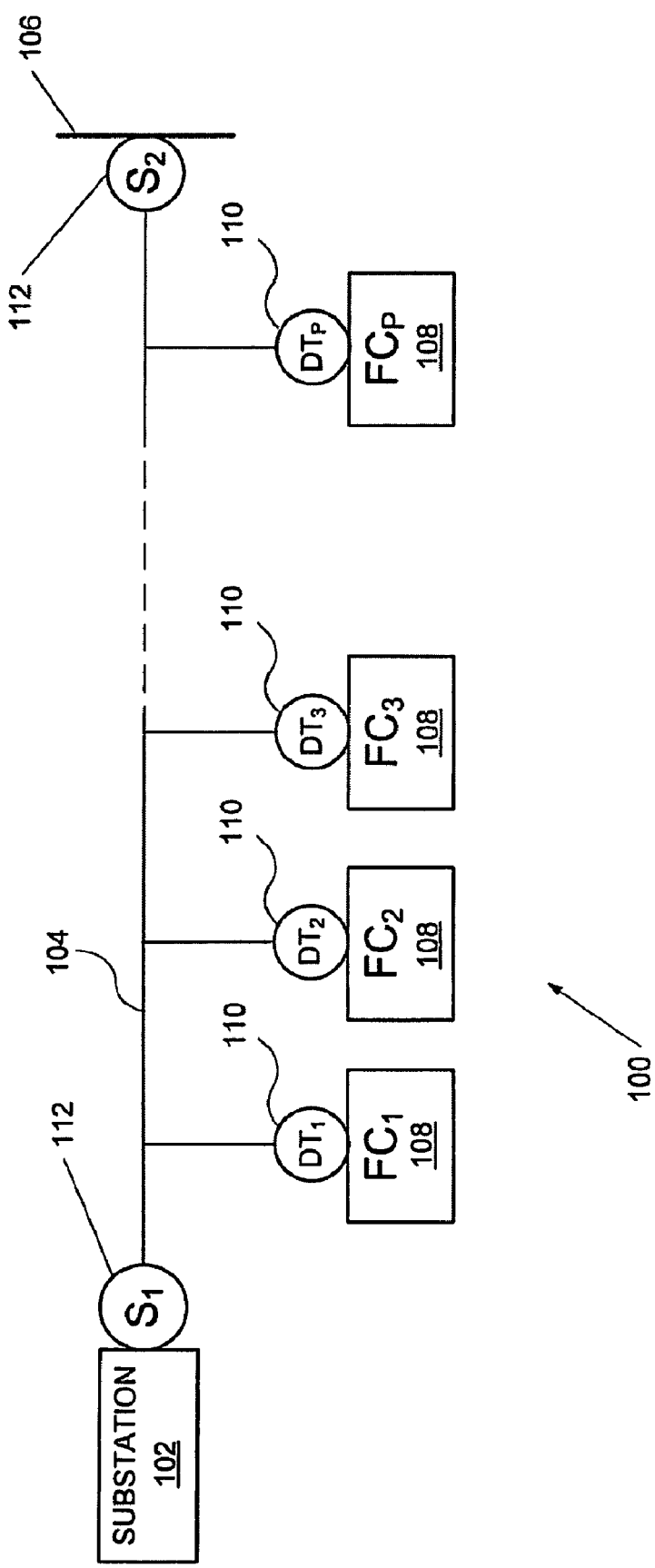
FIG. 1 is a diagrammatic view of an example of a distribution system.

FIG. 1 depicts a diagrammatic view of an example distribution system 100. The distribution system 100 may include a substation 102 that supplies power along a phase conductor line 104 to a circuit termination 106. Distribution systems, such as the distribution system 100, may include more than one phase conductor, such as in a three-phase utility distribution system. The diagrammatic view of FIG. 1 illustrates a single phase as an example; however, the concepts described may apply to a distribution system implementing a plurality of phases, such as in a 2-phase or 3-phase utility distribution system.

The distribution system 100 may include a plurality of feeder circuits 108. Each feeder circuit 108 is individually designated as $FC_1$ through $FC_P$ in FIG. 1. Each feeder circuit 108 may be configured to supply power to one or more customer circuits. Each feeder circuit 108 may be electrically connected to a secondary side of a corresponding distribution transformer 110. Each distribution transformer 110 is individually designated as $DT_1$ through $DT_P$. In one example, each distribution transformer 110 may be configured to step down (e.g., transform the voltage from a higher voltage at the primary side to a lower voltage at the secondary side) a voltage supplied from the substation 102 and to provide the stepped down voltage to the corresponding feeder circuit.

Sensors 112 may be placed along the phase conductor line 104 to measure various values associated with the phase conductor line 104, such as voltage and current at a point along the phase conductor line 104. In one example, sensors 112 may be configured to generate synchrophasor data, which may include voltage phasor measurements and current phasor measurements that are synchronized with simultaneous measurements occurring elsewhere within an associated distribution system. In FIG. 1, the sensors 112 are designated individually as S1 and S2, which may each measure phasor voltages and currents at a point of connection along the phase conductor line 104. The data collected by each sensor S1 and S2 may be synchronized for allowing various portions of the system to be monitored at a single point in time. In FIG. 1, the sensors 112 are shown as being located at ends of the phase conductor line 104. In alternative examples, the sensors 112 may be placed at any location along the phase conductor line 104, and more than two sensors may be positioned along the phase conductor line 104. The distribution system 100 may also include other circuit levels below the feeder circuits 108.

In the configuration shown in FIG. 1, voltages and currents associated with each feeder circuit 108 may be measured to determine the voltage and currents of the secondary side transformer of each corresponding distribution transformers 110. Each of these secondary side transformer voltages may be used to determine a corresponding primary side voltage of each distribution transformer 110. Each primary side voltage may be used along with synchrophasor data obtained from the sensors 112 to make determinations about the line conditions of the phase conductor line 104.

Figure 2:
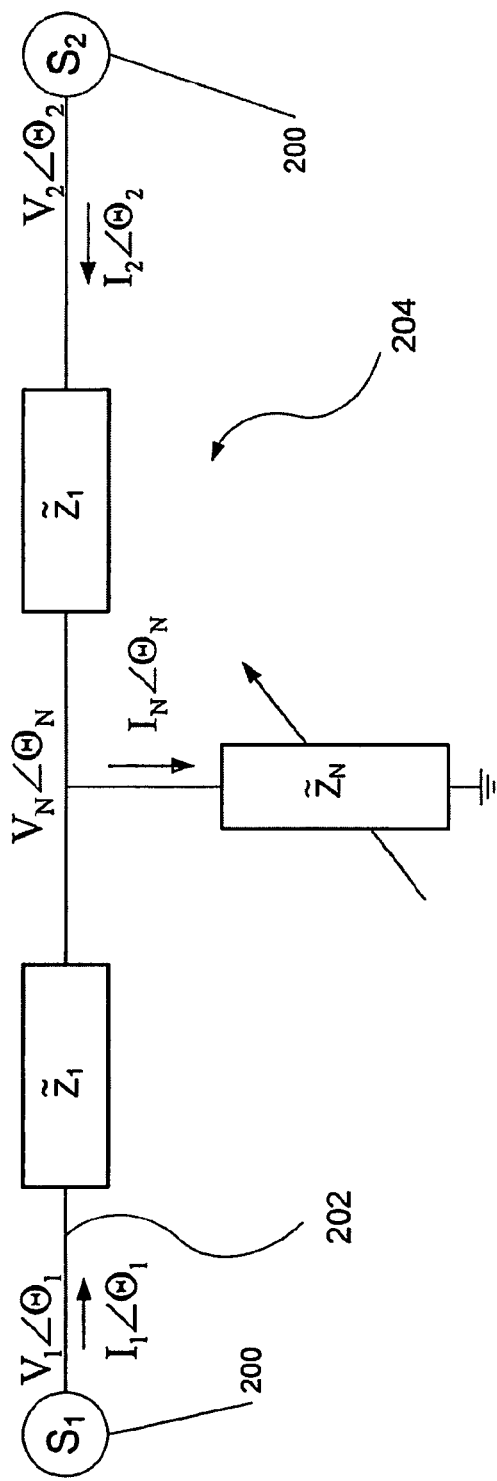
FIG. 2 is an example of a T-equivalent circuit of a distribution system.

FIG. 2 shows a diagrammatic view of sensors 200 configured to generate synchrophasor data that may be positioned along a section 202 of the phase conductor line 104. In one example, the section 202 may be the entire phase conductor line 104 as illustrated in FIG. 1. FIG. 2 shows the section 202 between the sensors 200 as being modeled as a T-equivalent circuit. The phase conductor line 104 may include one or more equivalent impedances, which may be represented as $\tilde{Z}_1$ blocks in FIG. 2 and any load impedance being designated as block $\tilde{Z}_N$. The arrow through the $\tilde{Z}_N$ block indicates the manner in which the load impedance may vary over time. In one example, the load impedance $\tilde{Z}_N$ may represent one or more feeder circuits electrically connected to the line section 202.

Similar to the sensors 112, the sensors 200 may be used to measure voltage and current phasors synchronized in a distribution system. These measurements allow state variables to either be measured or calculated for the T-equivalent model, which may provide relevant information used to determine a system response to new inputs. The manner in which a system reaches a present state has no effect on a future state. For a given state and admissible input, the future state of the system is uniquely determined. For example, the sensor S1 may measure the voltage phasor $\tilde{V}_1$ and current phasor $\tilde{I}_1$ at the point of connection of the line section 202. Similarly, the sensor S2 may measure the voltage phasor $\tilde{V}_2$ and current phasor $\tilde{I}_2$ at the point of connection of the line section 202. These values may be determined so that they are synchronized and used to calculate other state variables associated with the T-equivalent circuit, such as $\tilde{Z}_1$, $\tilde{Z}_N$, $\tilde{V}_N$, and $\tilde{I}_N$. Using the measured phasor voltages and currents, these values may be determined using a set of state variables equations set forth below:

$$\tilde{Z}_1 = (\tilde{V}_1 - \tilde{V}_2)/(\tilde{I}_1 + \tilde{I}_2) \qquad \text{EQN. 1}$$

$$\tilde{V}_N = \tilde{V}_1 - \tilde{I}_1 \tilde{Z}_1 = \tilde{V}_2 - \tilde{Z}_1 \qquad \text{EQN. 2}$$

$$\tilde{I}_N = \tilde{I}_1 - \tilde{I}_2 \qquad \text{EQN. 3}$$

$$\tilde{Z}_N = \tilde{V}_N / \tilde{I}_N \qquad \text{EQN. 4}$$

Using the synchrophasor data obtained on measurements by the sensors 200 allows the state variables to be determined at any instantaneous moment in time when the measurements of the sensors 200 are synchronized in time, such as through a global positioning system (GPS). The measurements of the state variables allow various phase conductor line conditions along the line section 202 to be determined, such as line temperature, which may be determined based on power dissipation. Additional measurements along the line section 202 may allow more resolution in determining power dissipation along the line section 202. In one example, the T-equivalent circuit 204 may be decomposed into smaller T-sections.

The T-equivalent circuit produces a T-matrix relating the $\tilde{V}_1$, $\tilde{I}_1$ values to the $\tilde{V}_2$, $\tilde{I}_2$ values as follows:

$$\begin{bmatrix} \tilde{V}_1 \\ \tilde{I}_1 \end{bmatrix} = \begin{bmatrix} A & B \\ C & D \end{bmatrix} \begin{bmatrix} \tilde{V}_2 \\ \tilde{I}_2 \end{bmatrix} \qquad \text{EQN. 5}$$

where the T-matrix is a transfer function providing a relationship between input voltages and currents and output voltages and currents of a T-equivalent circuit.

Figure 3:
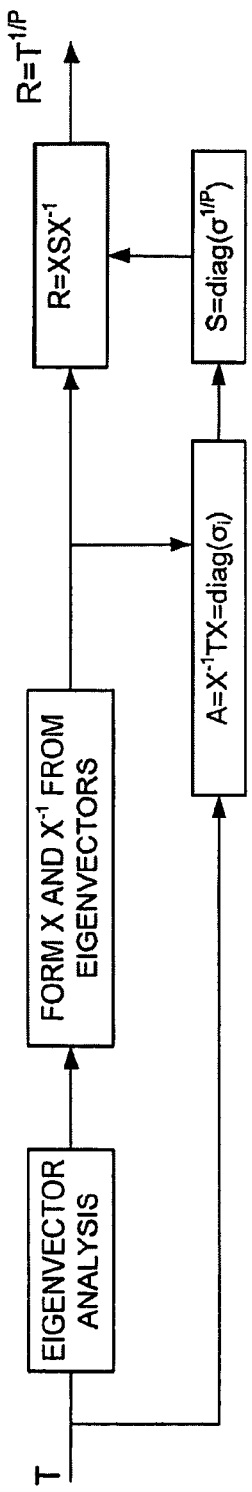
FIG. 3 is an example of a technique for decomposing a T-equivalent circuit.

In one example, the T-matrix may be decomposed into P different T-sections. FIG. 3 shows a flow diagram of an example decomposition technique 300 of a T-equivalent circuit into P T-sections. In FIG. 3, the eigenvectors may be determined through an eigenvector analysis. As shown in FIG. 3, the eigenvectors ultimately allow P different T-sections to be determined. The eigenvector technique of FIG. 3 uses two properties of matrices: the matrix eigenvectors may be used to calculate an equivalent matrix that is diagonal in form; and the $P^{th}$ root of a diagonal matrix may be found by calculating the $P^{th}$ root of each of the diagonal entries independently. Using this technique, the T-matrix may be decomposed into an arbitrary number of T-sections, which may be cascaded back together to yield the original T-matrix.

Figures 4, 5:
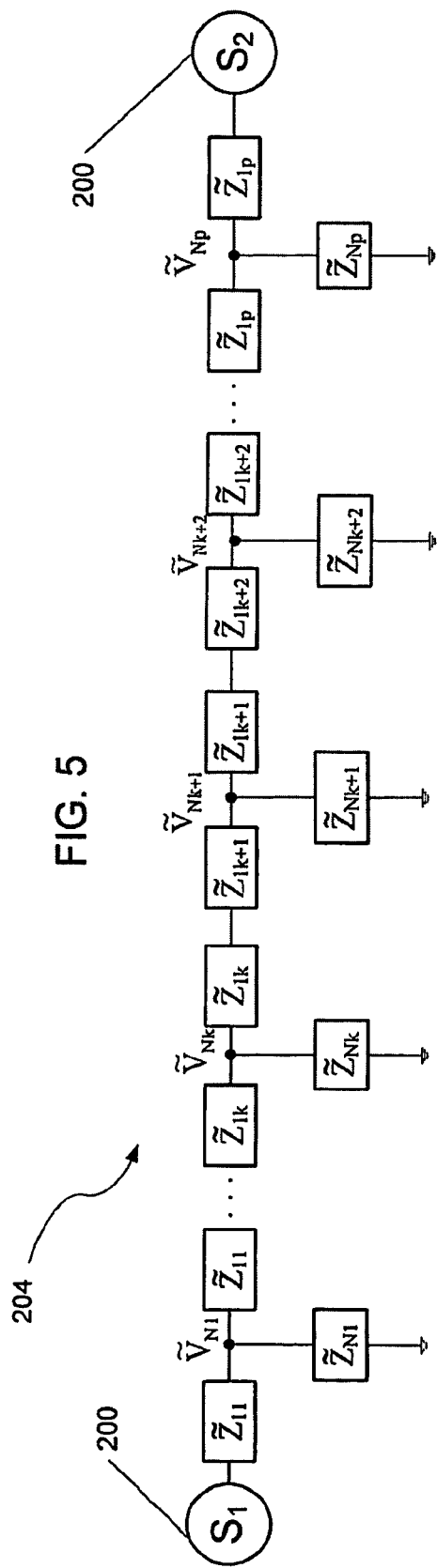
FIG. 4 is another example of a technique for decomposing a T-equivalent circuit.
FIG. 5 is an example of the decomposed T-equivalent circuit of FIG. 2.

In another example, the T-matrix of Eqn. 5 may be decomposed into smaller T-sections for analysis. In one example, the T-matrix may be factored into two square root components 400 as shown in FIG. 4. This decomposition technique allows N factorizations to occur resulting in 2N T-sections.

Applying the decomposition technique of FIG. 3 to the T-equivalent circuit 204 of FIG. 2 may result in P concatenated T-equivalent circuits such as that shown in FIG. 5. Each T-section may include a line impedance represented by respective $\tilde{Z}_1$ blocks and a respective load impedance $\tilde{Z}_N$. In one example, a line section 202 may include P feeder circuits between each synchrophasor S1 and S2, such as the feeder circuits 108 shown in FIG. 1. This allows each T-section in FIG. 5 to include representation of a distribution transformer associated with a feeder circuit.

Including representation of a distribution transformer in each T-section may allow the primary side voltage of each distribution transformer to represent an estimate of the magnitude of each node voltage $\tilde{V}_N$, 1 through P, associated with each T-section during analysis. Once each node voltage $\tilde{V}_N$ is established, the voltage drops between adjacent node voltages $\tilde{V}_N$, as well as between each sensor S1 and S2, and an adjacent node voltage $\tilde{V}_N$ may be determined based on system measurements. The voltage drops allow the various line conditions to be determined, such as line temperatures based on dissipated power in line sections. For example, when $\tilde{Z}_1$ in a T-equivalent circuit of FIG. 2 is determined, the impedance per distance may be determined since the length of the line section 202 is typically known or may be estimated. Thus, each impedance $\tilde{Z}_1$ of the smaller T-sections in FIG. 5 may be determined based on the line length either between a sensor S1 and S2 and an adjacent distribution transformer or between adjacent distribution transformers.

In one example, the power dissipated may be determined through the relationship of $P = V^2/R$, where V is the voltage drop between adjacent voltage nodes $\tilde{V}_N$ or between a sensor 200 and a voltage node $\tilde{V}_N$. R is the real part of the line impedances between voltage values, either from the distribution transformers or the sensors. The dissipated power may be used to determine temperatures of segments between sensor points (e.g., sensors and the primary side of a distribution transformer) of the line section 202, which may be used for fault analysis.

Figure 6:
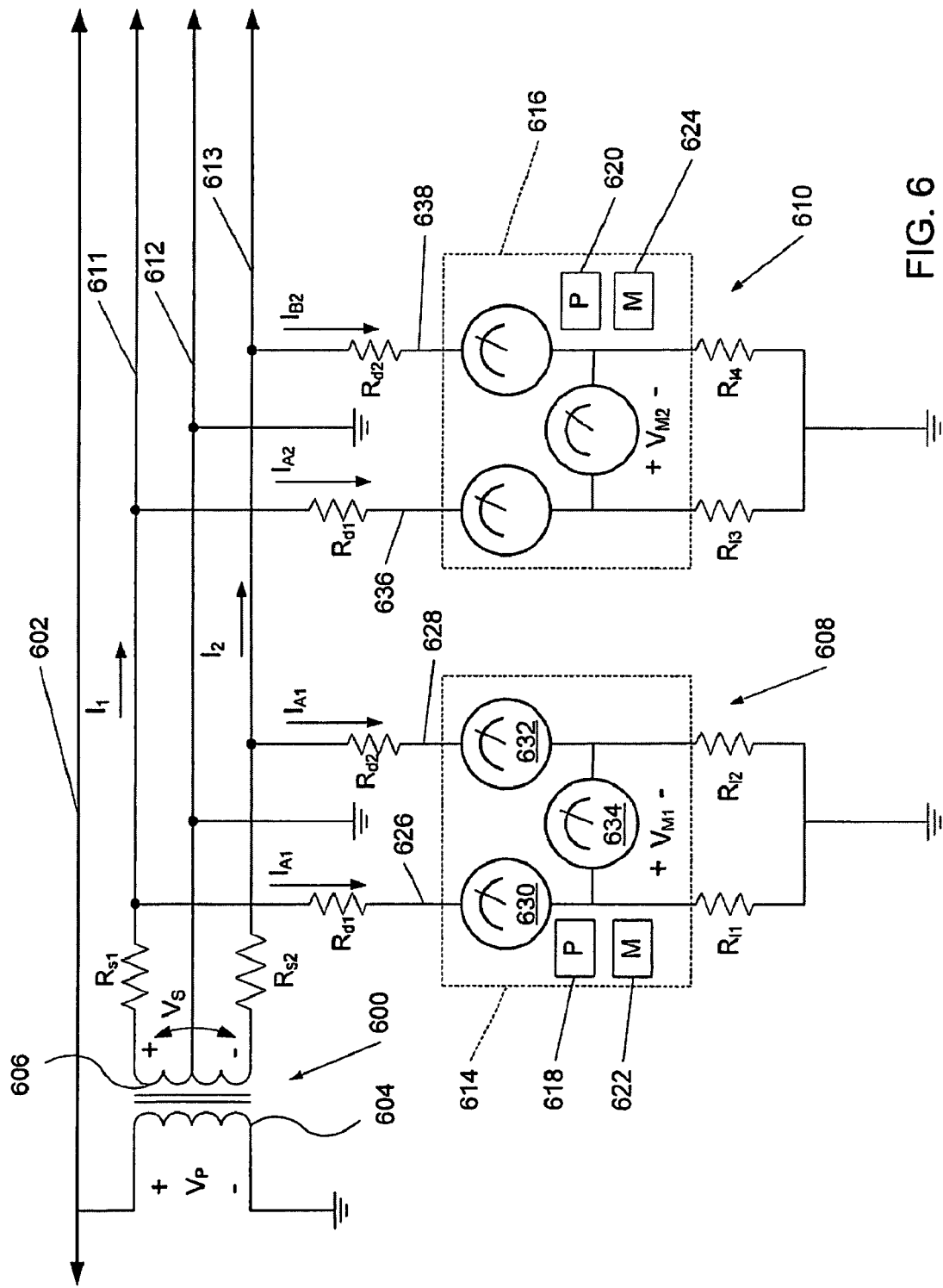
FIG. 6 is a diagrammatic view of a portion of a distribution system.

In one example, the primary side voltage of a distribution transformer 600 may be determined based on a respective secondary side voltage. FIG. 6 shows an example of a feeder circuit configuration that may be used to determine primary side distribution transformer voltages. FIG. 6 shows a phase conductor line 602. A primary winding 604 of the distribution transformer 600 may be electrically connected to the phase conductor line 602 and have a primary side voltage $V_P$. A secondary winding 606 of the distribution transformer 600 may be electrically connected to one or more customers forming loads on the secondary side of the transformer 600. In the example of FIG. 6, two customer circuits 608, 610 are shown, but more customer circuits may be connected to the distribution transformer 602. Each customer circuit 608, 610 is shown as being connected to the secondary winding 606 in a split-phase configuration. The split-phase connection allows a customer circuit to be connected across the secondary winding 606, with a center tap 612 shown as being grounded. The split-phase configuration allows a secondary side voltage $V_S$ to be received by the customer circuits 608, 610. In other examples, the customer circuits may be connected to the secondary winding 606 in any other configuration.

Power distributed to each customer circuit 608, 610 may be measured and recorded with a meter 614, 616, respectively. Each meter 614, 616 may include a processor 618, 620, respectively, and a memory 622, 624, respectively. The meters 614, 616 may use the respective processors and memories to process the power consumption. Each meter 614, 616 may include an analog-to-digital converter (not shown) allowing the meters 614, 616 to process digital power usage data. Each meter 614, 616 may operate in substantially the same manner in FIG. 6, thus an example describing customer circuit 608 may apply to customer circuit 610, as well as to other customer circuits that may be connected to the feeder circuit shown in FIG. 6.

In one example, customer circuit 608 may be consuming power supplied from the phase conductor line 600. In the split-phase configuration shown in FIG. 6, current $I_1$ may flow through the secondary winding 606 through conductor line 611 and current $I_2$ may flow through conductor line 613. The conductor lines 611, 613 may each include common line losses $R_{s1}$ and $R_{s2}$, which represent common line losses shared by each connected customer circuit. At least a portion of each of the currents $I_1$ and $I_2$ may flow through branches 626, 628, respectively, of the customer circuit 608 and are represented by branch currents $I_{A1}$ and $I_{B1}$ in FIG. 6.

Each branch 626, 628 may each include a service drop line loss $R_{d1}$, $R_{d2}$, respectively. The branch currents $I_{A1}$ and $I_{B1}$ each flow through the meter 614. The meter 614 may include internal current meters 630, 632 to measure branch currents $I_{A1}$ and $I_{B1}$. The meter 614 may also include an internal volt meter 634 that may determine meter voltage $V_{M1}$ based on the current differential between branch currents $I_{A1}$ and $I_{B1}$. The customer circuit 608 may also include a load represented as $R_{l1}$ and $R_{l2}$ in FIG. 6.

Similarly, the customer circuit 610 may receive branch currents $I_{A2}$ and $I_{B2}$, which may each be only a portion of currents $I_1$ and $I_2$, respectively. Each branch current $I_{A2}$ and $I_{B2}$ may flow through a respective branch 636, 638 having the service drop line losses $R_{d1}$, $R_{d2}$. The branch currents $I_{A2}$ and $I_{B2}$ may be measured by the meter 616, and a meter voltage $V_{M2}$ may be determined for the customer circuit 610. The customer circuit 610 may include a load represented as $R_{l3}$ and $R_{l4}$ in FIG. 6.

In one example, a relationship between the meter voltages $V_{M1}$ and $V_{M2}$ and the secondary voltage $V_S$ may be used to determine the secondary voltage $V_S$. The relationship may be represented as:

$$\begin{bmatrix} 1 & 0 & 0 & -I_1[1] & 0 & -I_T[1] \\ 1 & 0 & 0 & 0 & -I_2[1] & -I_T[1] \\ 0 & 1 & 0 & -I_1[2] & 0 & -I_T[2] \\ 0 & 1 & 0 & 0 & -I_2[2] & -I_T[2] \\ 0 & 0 & 1 & -I_1[3] & 0 & -I_T[3] \\ 0 & 0 & 0 & 1 & -I_2[3] & -I_T[3] \end{bmatrix} \begin{bmatrix} V_S[1] \\ V_S[2] \\ V_S[3] \\ R_{d1} \\ R_{d2} \\ R_s \end{bmatrix} = \begin{bmatrix} V_{M1}[1] \\ V_{M2}[1] \\ V_{M1}[2] \\ V_{M2}[2] \\ V_{M1}[3] \\ V_{M2}[3] \end{bmatrix} \quad \text{EQN. 6}$$

In Eqn. 6, "[1]" may represent the value of the respective variable at a first time instant, "[2]" may represent the value of the respective variable at a second time instant, and "[3]" may represent the value of the respective variable at a third time instant. In Eqn. 6, various assumptions may be made such as $R_{s1}=R_{s2}=R_s/2$ and $R_{d1}=R_{d2}$. In other examples, additional time instants may be used.

In Eqn. 6, $I_T=I_1+I_2$ and represents the total current flowing through the customer circuits. Currents $I_1$ and $I_2$ may be found by summing the currents in the corresponding branches of each customer circuit. This allows current $I_T$ to be determined by using the current values determined by each meter and summing the measured currents together. In Eqn. 6, the matrix containing current values may be inverted and multiplied by the matrix containing the meter voltages $V_{M1}$ and $V_{M2}$ at three selected time instants. This allows the matrix containing the secondary voltage $V_S$ to be determined for the three selected time instants. Thus, each determined secondary voltage $V_S[1]$, $V_S[2]$, and $V_S[3]$ may each be used for the respective time instant. Each of these values may be used to determine the primary voltage $V_P$ at the respective time instant based on the turns ratio of the transformer 602.

The configuration of FIG. 6 depicts an example in which metered loads associated with customer circuits on a distribution system may be used to determine the primary side voltage of a connected transformer delivering power to the load. In other examples, the metered loads may be used to determine the primary side voltage of a transformer providing power to the metered loads with equipment positioned between the metered loads and the transformer. For example, in the configuration shown in FIG. 6, various equipment such as relays or switches may be connected between the customer circuits 608, 610 and the transformer 600. In other examples, other transformers may be positioned between the transformer 600 and the customer circuits 608, 610. The metered loads associated with the customer circuits 608, 610 may be used in these alternative examples to determine a primary side voltage associated with the transformer 600 connected to the phase conductor line The primary side voltage of distribution transformers, such as the distribution transformer 600, may be determined in other manners. In one example, a distribution system may include a power-line based communication system. The power-line-based communication system may be configured to operate on a distribution system such as the distribution system 100 in FIG. 1. The power-line-based communication system may include bridge elements located at each distribution transformer, such as distribution transformers $DT_1$ through $DT_P$. The bridge elements may allow the secondary side transformer voltages to be measured and transmitted along the power-line-based communication system. Each secondary side transformer voltage may be used to determine the corresponding primary side voltage based on the turns ratio.

Figure 7:
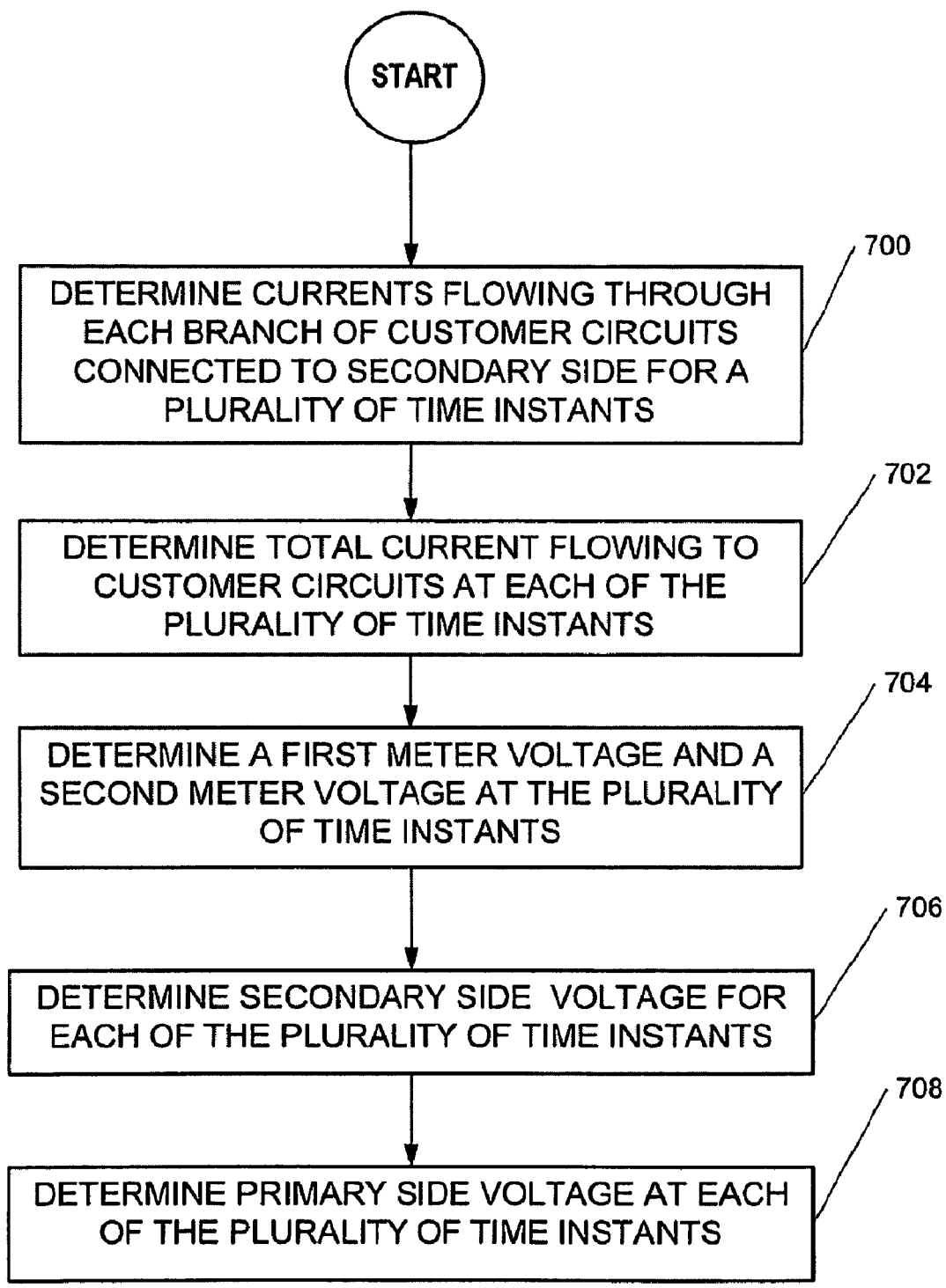
FIG. 7 is a flow diagram of an example operation used to determine a primary side voltage of a distribution transformer.

FIG. 7 shows a flow diagram of an example operation to determine a primary side voltage of a distribution transformer. A step 700 may include determining measured currents flowing through each branch of each customer circuit connected to a secondary side of the distribution transformer for a plurality of time instants. In one example, the step 700 may be performed using meters connected in the manner shown in FIG. 6 in regard to the meters 614, 616. This arrangement allows each meter to measure current flowing through a respective branch for a number of time instants, such as three time instants. These currents may be summed together at each time instant for each branch providing the total current flowing through the corresponding branches.

The operation may also include a step 702 of determining the total current flowing through each customer circuit for the plurality of time instants. In one example, the total current at each of the plurality of time instants may be found by summing the currents measured by each meter at each of the plurality of time instants. In one example, step 702 may be performed using meters such as the meters 614, 616 shown in FIG. 6. The operation may also include a step 704 of determining a first meter voltage and a second meter voltage at the plurality of time instants. In one example, step 704 may be performed in a manner described in regard to FIG. 6 using the meters 614, 616. The operation may also include a step 706 of determining a secondary side voltage of the distribution transformer at each of the plurality of time instants. In one example, step 706 may be performed in a manner described in regard to FIG. 6, which may use Eqn. 6 to determine the secondary side voltages at each of three time instants. The operation may also include a step 708 of determining the primary side voltage of the distribution transformer. In one example, this may be performed by determining the primary side voltage using a turns ratio and the secondary side voltage of the distribution transformer.

Figure 8:
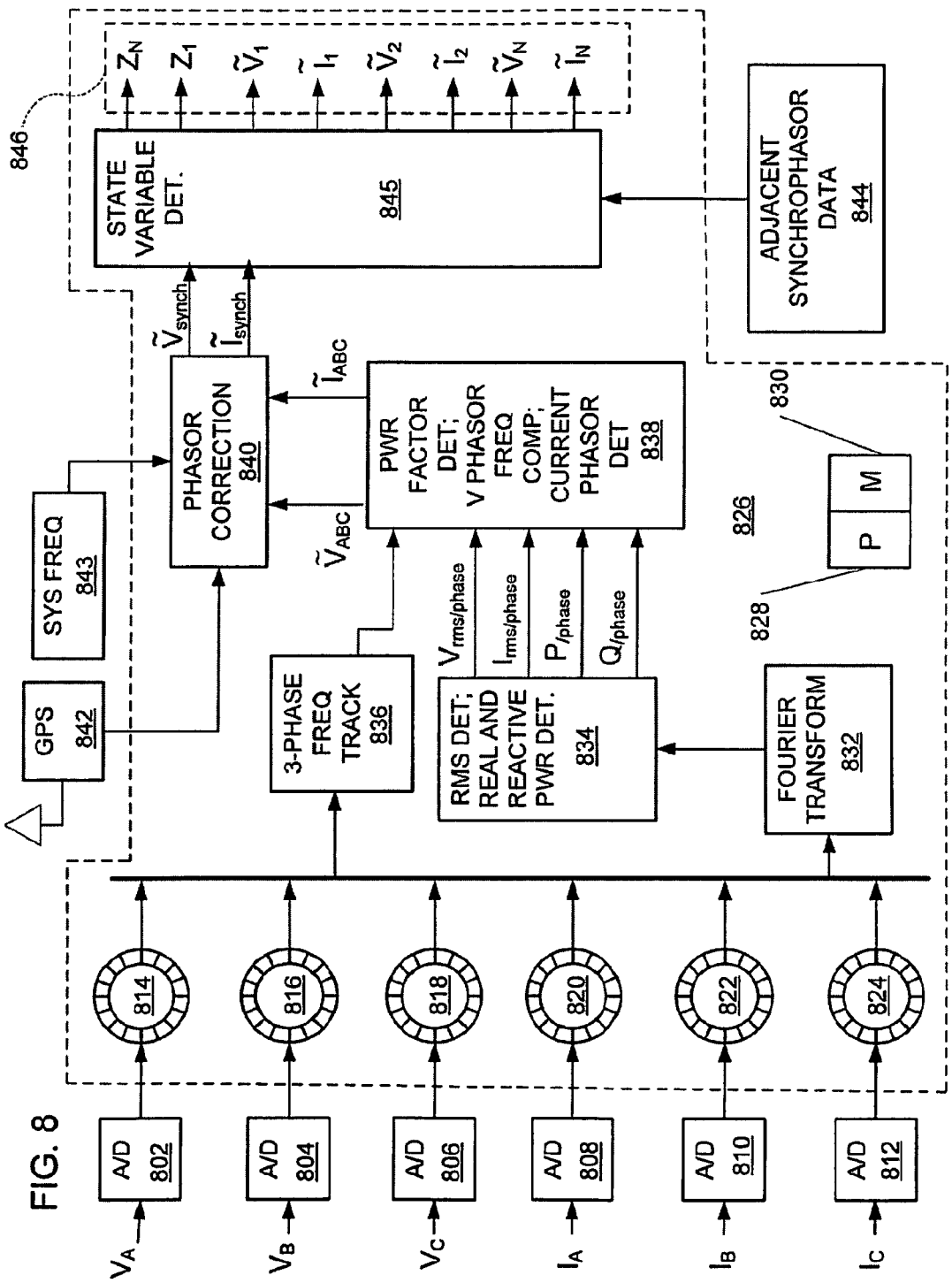
FIG. 8 is an example of a system configured to determine state variable values in a distribution system.

Determining a primary side transformer voltage, or node voltage $\tilde{V}_N$, for each associated T-section shown in FIG. 6 allows the node voltages to be used to determine power losses along sections of a phase conductor as previously described. In one example, the analysis to determine phase conductor line conditions may be determined using example configurations shown in FIGS. 8 and 9. FIG. 8 shows an example system configured to generate state variables using phasor data obtained from a pair of sensors, which may be used to generate synchrophasor data for a phase conductor line section between the pair of sensors, such as that shown in FIG. 1. The associated state variables may be used to determine phase conductor line conditions, such as temperature based on power dissipation. Primary side voltages, such as those determined based on meter data may be used for various other applications, such as feeder voltage regulation, distribution transformer detection and classification, power outage detection and localization, and power restoration tracking, for example.

The system of FIG. 8 is shown as receiving voltage and current measurements for a three-phase system having phases A, B, and C. The voltages $V_A$ through $V_C$ and the currents $I_A$ through $I_C$ may be determined through line sensors (not shown). The sensed voltages $V_A$ through $V_C$ and sensed currents $I_A$ through $I_C$ may be received by a respective A/D converter 802 through 812. The digitized voltage and current data may be received and stored in a respective digital storage device, such as the data ring buffers 814 through 824. The digitized data may be used to determine the state variable values for each phase at a particular time. The digitized data may be received by a computer device 826 having a processor 828 and a memory 830. The computer device 826 may use the digitized data for each phase to generate state variables associated with each phase.

The digitized phase data may be transformed to the frequency domain by the computer device 826 through Fourier transform module 832. The computer device 826 may process the frequency domain data in determining root mean square (RMS) information for each phase voltage ($V_{RMS}$) and current ($I_{RMS}$), as well as real power (P) and reactive power (Q) through a module 834. The digitized phase data may also be used by the computer device 826 in a three-phase frequency tracking module 836 to determine the line frequency.

Figure 9:
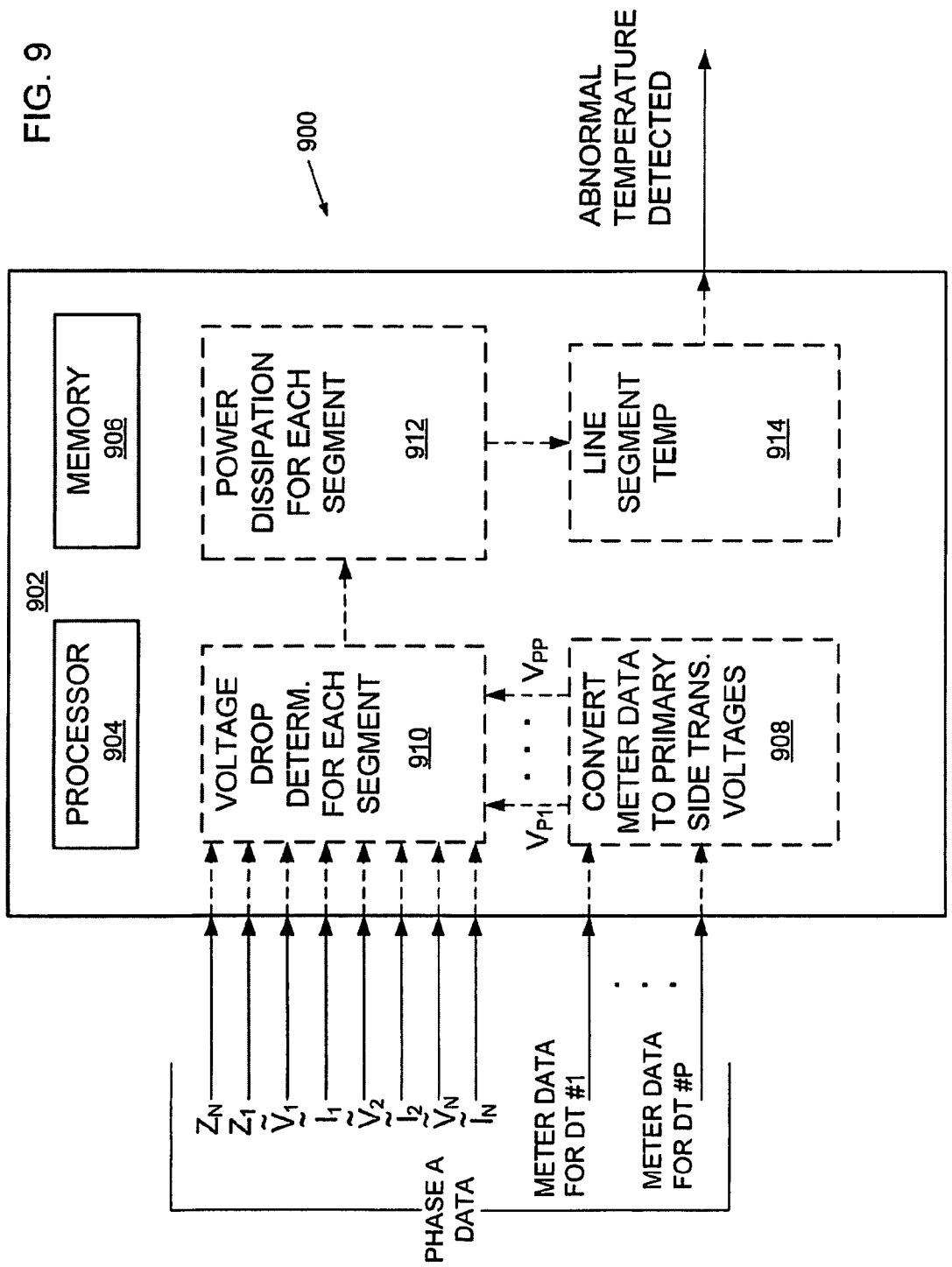
FIG. 9 is an example of a system configured to determine line conductor faults.

The RMS voltages and currents for each phase, real and reactive power for each phase, and the line frequency may be used by the computer device 826 at module 838 which may include a power factor determination, voltage phasor frequency compensation, and current phasors determination for each phase from corresponding voltage phasors, current magnitudes, and power factors for each phase. The module 838 may generate voltage phasors ($\tilde{V}_{ABC}$) and current phasors ($\tilde{I}_{ABC}$) for each phase. The computer device 826 may include a phase correction module 840, which receives a GPS signal from a GPS signal source 842 and an AC voltage system frequency from a system frequency source 843, which results in generating synchrophasor data for a line sensor. The synchrophasor data for each phase $\tilde{V}_{synch}$, $\tilde{I}_{synch}$ may be used by the computer device 826 in a state variable determination module 845, which also implements synchrophasor data from a synchrophasor data module 844 from another adjacent sensor to determine state variables for each phase for a section of a line conductor. In FIG. 9, a set of state variables 846 is shown which may represent state variable values for each of the three phases.

The computer device 826 may be a computer device connected to a distribution system such as in a remote terminal unit (RTU). In one example, the computer device 826 may generate the state variables and transmit the state variables to a centralized location for use by another computer device. In an alternative example, the computer device 826 may transmit the synchrophasor data $\tilde{V}_{synch}$ and $\tilde{I}_{synch}$ to the centralized location which may also receive synchrophasor data for an adjacent line sensor, which allows the state variables to be determined at the centralized location.

Upon determination of the state variables for each phase, the state variables may be used along with primary voltages of the distribution transformers for a corresponding phase to determine phase conductor line section conditions. FIG. 9 shows a system 900 that may be configured to determine the conditions for a line section of phase A. However, a line section of any other phase, B or C, may be analyzed in substantially the same manner.

In one example, the system 900 may include a computer device 902. The computer device 902 may be a single computer device or a number of computer devices. In the example of FIG. 9, the computer device 902 includes a processor 904 and a memory 906. The processor 904 and the memory 906 may be used to process the state variable values and customer circuit meter data. In one example, the computer device 902 may be located at a centralized location to receive state variable data from data collection devices such as RTUs located throughout a metered distribution system. Other devices may be used to capture and determine system data, such as voltage and current sensors or any other device or mechanism capable of capturing distribution system related data and calculating state variable values. In alternative examples, the computer device 902 may receive synchrophasor data measurements to determine the state variable values. The computer device 826 in FIG. 8 may also be used to perform the operations and modules associated with the computer device 902.

In FIG. 9, the computer device 902 may receive the state variables and customer circuit meter data for distribution transformers connected to a line segment being analyzed by the computer device 902. In one example, the computer device 902 may implement a module 908 to process the customer circuit meter data in a manner described in regard to FIG. 6 to generate primary side voltages associated with respective distribution transformers positioned at various points along a line section being analyzed. In one example, the computer device 902 may query a data query device responsible for obtaining meter data associated with customer circuits in a distribution system, such as an RTU, a supervisory control and data acquisition system (SCADA), a meter system, or any other data capture device or system.

The primary side voltages may be used with the state variables by the computer device 902 in module 910 to determine the voltage drops along phase conductor line segments between sensor points, which may include sensors generating synchrophasor data, as well as, node voltages on the primaries of the distribution transformer. In one example, the module 910 may implement a T-section analysis as previously described. The computer device 902 may perform a power dissipation determination at module 912 for each segment. The determined power dissipation for each segment may be used by the computer device 902 at module 914 to determine line segment temperature for each segment and generate an output signal indicating any segments having abnormal temperatures, which may indicate a fault along that segment.

In another example, secondary side transformer voltages $DT_1$ through $DT_P$ may be determined using the bridge elements of a power-line-based communication system. The secondary side voltages may be transmitted through the power-line-based communication system to the computer device 902 and converted to primary side transformer voltages at the module 912. In another example, the secondary side voltages received by the computer device 902 may be a combination of secondary side voltages from meters or bridge elements of a power-line-based communication system.

Figure 10:
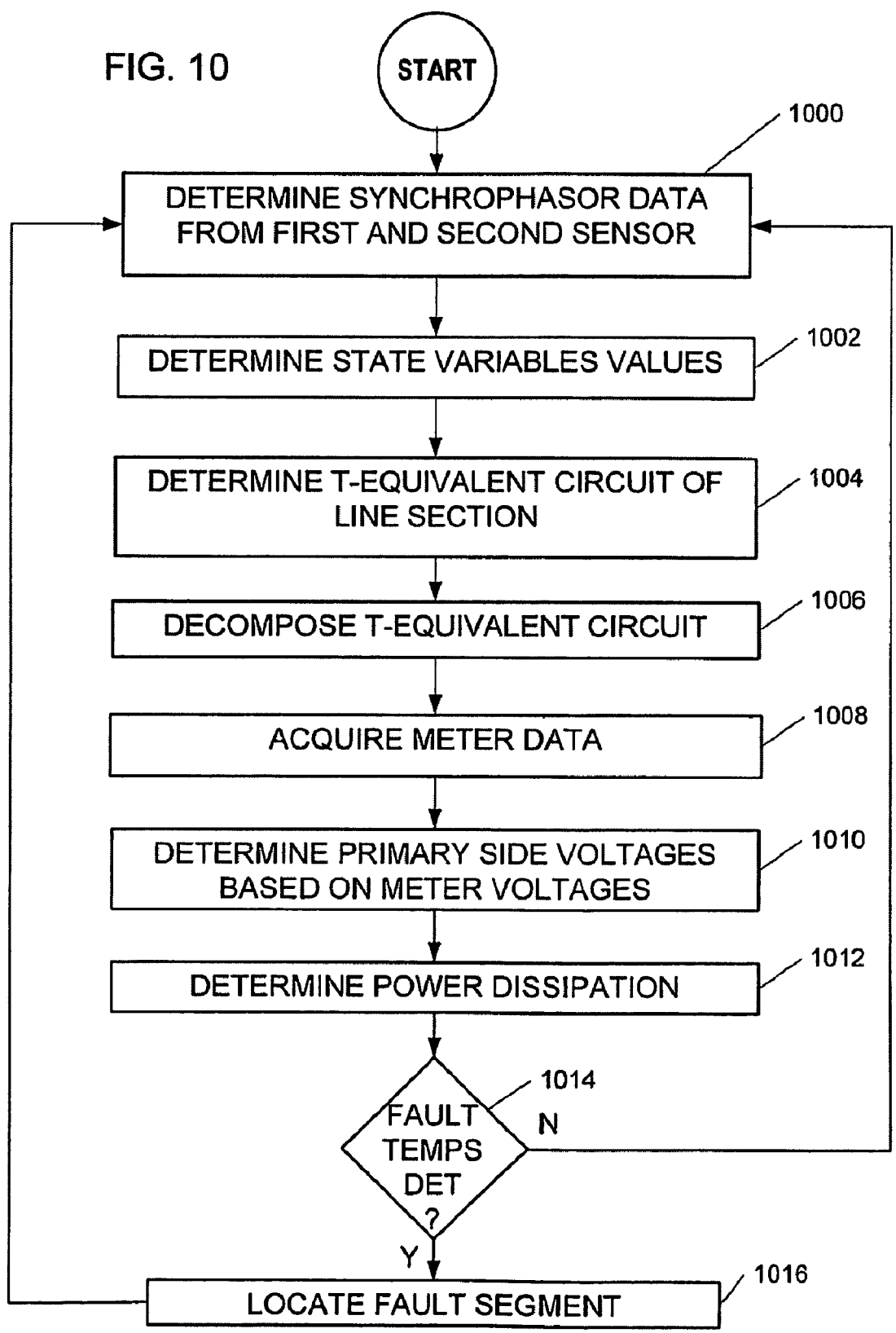
FIG. 10 is a flow diagram of an example operation to determine phase conductor line faults in a distribution system.

FIG. 10 shows a flow diagram of an example operation to determine phase conductor line conditions. A step 1000 may include determining synchrophasor data based on output from a first and second sensor. In one example, step 1000 may be performed using a configuration such as that shown in FIG. 2 in which sensors S1 and S2 are positioned along a line section 202 and configured to generate data that may be used to determine synchrophasor data.

The operation may include a step 1002 of determining state variable values associated with the line section between the first and second sensors. In one example, step 1002 may be performed using the synchrophasor data and Eqns. 1 through 4. The operation may also include a step 1004 of determining a T-equivalent circuit of the line section between the first and second sensors. In one example, this may be performed using the state variables determined at step 1002.

The operation may also include a step 1006 of decomposing a T-equivalent circuit into smaller T-sections. In one example, step 1006 may be performed in a manner described in regard to FIG. 3 or 4. The operation may also include a step 1008 of determining meter data from power meters connected to a secondary side of distribution transformers, which may be connected to the line segment between the first and second sensors. The operation may also include a step 1010 of determining the primary side voltages for each distribution transformer electrically connected to the line segment between the first and second sensors. In one example, step 1010 may be performed in a manner described in regard to FIG. 6 using the acquired meter data.

The operation of FIG. 10 may also include a step 1012 of determining power dissipation in a plurality of line segments between the first and second sensors. In one example, step 1012 may be performed using the state variable values and the primary side voltages of the distribution transformers between the first and second sensors in a T-equivalent circuit analysis. As previously described, based on the state variable values determined in a T-section analysis, the impedance per distance may be determined for a line segment between the first and second sensors. This impedance per distance may be used with the determined primary side transformer voltages to determine each line segment between adjacent distribution transformers and the first and second sensors.

The operation may include a step 1014 of determining if excessive temperatures exist along any of the line segments. If excessive temperatures are detected, step 1016 may be performed to determine the feeder segment associated with the excessive temperature. If fault temperatures are not detected, the operation may continuously be performed to monitor the phase conductor line section between the first and second sensors. The operation of FIG. 10 may be used to determine other phase conductor line conditions associated with fault conditions, such as phase-to-phase, phase-to-ground, three phase faults (short circuits) and open phase faults (circuit open on the down stream side, so that no fault current flows).

A distribution system may include various structural or topological levels as voltage power is distributed and as feeders branch into various sections. These various levels may all be decomposed into T-sections, allowing a system to be continuously analyzed in a manner as previously described. Sensor points may be determined throughout a distribution system from which to receive data for analyzing a system implementing T-section analysis. These sensor points may be locations within distribution system levels at which to position sensors for measuring system values, such as sensors S1 and S2 shown in FIG. 1, as well as locations selected metering points for system analysis as discussed in regard to FIG. 6.

FIG. 11 shows a flow diagram of an example operation to determine sensor points throughout a distribution system. A step 1100 may include loading a topographical map of a distribution system. In one example, the map may be loaded onto a computer device, such as the computer device 902 of FIG. 9. A computer device or devices, such as the computer device 902, may execute the entire operation of FIG. 11. The topographical map may be a distribution system model including various distribution system equipment that may be used to obtain system data.

A step 1102 may include determining sensor points at a first level of a distribution system based on a first predetermined criteria and an input criteria. The topographical map may be used to determine the locations of any determined sensor points. In one example, the first level of a distribution system may be a feeder circuit level. The feeder circuit level may include a circuit from a substation to an end of a circuit. In one example, sensor points may be selected in which to position sensors configured to obtain synchronized phasor data for analysis. The first level may also include feeder circuit sections, which may be sections of a feeder circuit defined by interconnection equipment such as circuit relays or fuses. The first level may also include feeder segments, which may be defined by various factors for analysis, such as selected areas within a distribution system that may be desired for more resolute analysis in comparison to other areas of a distribution system.

In one example, the first predetermined criteria may represent a generalized system configuration, which may determine sensor points at various predetermined conventional sensor locations. In another example, the first predetermined criteria may be contractual obligations. A customer connected to a distribution system may have a contract with a power supplier to receive monetary compensation in an event of a power outage. This criterion may be used to more closely monitor customers of this nature relative to the other customers, which may require more sensor points than other areas of the distribution system.

In another example, the input criteria may be selected based on the particular configuration of the distribution system being analyzed, such as load distribution. Within a system, certain circuits may historically experience load volatility in particular areas within a distribution system. The input criteria allow sensor points to be determined based on the load distribution considerations of a particular distribution system.

The operation of FIG. 11 may include a step 1104 of determining if sensor points are to be positioned at a second level of the distribution system. In one example, the decision at step 1104 may be based on the first criteria. If sensor points are to be positioned, step 1106 may include determining sensor points on the map at the second level based on the first predetermined criteria and the user input criteria. In one example, the second level of the distribution system may include a feeder branch level. A feeder branch level may be one or more circuits that branch from the feeder circuit. In one example, the feeder branch level may be circuits stepped down in voltage at a transformer or may be the same voltage as the feeder circuit. The second level may also include one or more branch segment levels, which may be segments of the feeder branch levels determined by load considerations or other system considerations such as a particular circuit configuration.

The operation may further include a step 1108 of determining if sensor points are to be positioned at a third level of the distribution system. In one example, the decision at step 1108 may be based on the first predetermined criteria and the input criteria. If sensor points are to be positioned, a step 1110 may include determining sensor points on the map at the third level based on the first criteria. In one example, the third level of the distribution system may include a lateral level. A lateral level may be one or more circuits that branch from the feeder circuit or from a feeder branch, and thus may branch from a first and second level. In one example, the lateral level may be a distribution system circuit directly connected to a customer, such as the circuit configuration shown in FIG. 6. The third level may also include one or more lateral segment levels, which may be segments of the feeder branch levels determined by load considerations or other system considerations such as a particular circuit configuration. The sensor points for the third level may be determined for positioning sensors for obtaining data used for synchrophasor analysis, or the sensor points may be customer meters, such as that described in regard to FIG. 6. The customer meters data may be used for system analysis along with sensor data, such as in a manner previously described.

The operation may include a step 1112 of determining if additional sensor points are to be positioned based on the first predetermined criteria and input criteria. If additional sensor points are to be positioned, a step 1114 may include determining sensor points on the map at the first, second, and third levels of the distribution system based on a second predetermined criteria. In one example, the additional sensor points may be determined to be positioned at least one fault location level. A distribution system may include an area more susceptible to faults for various reasons, such as environment, load, circuit configuration, etc. These reasons may represent the second predetermined criteria in determining the position of a fault location level and if additional sensor points are to be used. Additional sensor points may also be determined at step 1114 based on predetermined criteria such as locations of system capacitor banks or distributed generation systems, such as combustion turbines or fuel cells, for example. The sensor points determined at step 1114 may either be sensors configured to obtain data for synchronized phasor analysis or may be meter data based upon meter availability.

The operation of FIG. 11 may allow analysis of a distribution system to determine phase conductor line conditions. In one example, upon sensor point determination through the operation of FIG. 11, the sensors may either be placed, or used if already in place, to gather data allowing a state variable to be determined at various sections of the phase conductors in the distribution system using a T-equivalent circuit for analysis. Data from meters selected as sensor points may also be used for the distribution system analysis allowing various phase conductor line conditions to be determined, such as in the manner described in regard to FIG. 9.

Although specific components of innovations were described, methods, systems, and articles of manufacture consistent with the innovation may include additional or different components. For example, processors 828 and 902 may be implemented as a microprocessor, microcontroller, application specific integrated circuit (ASIC), discrete logic, or a combination of other type of circuits or logic. Similarly, memories 830 and 906 may be DRAM, SRAM, Flash or any other type of memory. Flags, data, databases, tables, entities, and other data structures may be separately stored and managed, may be incorporated into a single memory or database, may be distributed, or may be logically and physically organized in many different ways. Programs may be parts of a single program, separate programs, or distributed across several memories and processors. Additionally modules 832, 834, 836, 838, 840, 845, 908, 910, 912, and 914 may be software or hardware implementations on the associated processors and memories.

While various embodiments of the innovation have been described, it will be apparent to those of ordinary skill in the art that many more embodiments and implementations are possible within the scope of the innovation. Accordingly, the innovation is not to be restricted except in light of the attached claims and their equivalents.

I claim:

1. A method for determining a primary side voltage of a distribution transformer comprising:
   determining a first current flowing through a secondary winding of the distribution transformer at a plurality of time instants based on current meter data generated by a plurality of metered loads connected to a secondary side of the distribution transformer;
   determining a second current flowing through the secondary winding of the distribution transformer at the plurality of time instants based on the current meter data generated by the plurality of metered loads connected to the secondary side of the distribution transformer;
   determining a total current flowing to the plurality of metered loads for each of the plurality of time instants based on the first current at the plurality of time instants and the second current at the plurality of time instants;
   receiving a respective meter voltage from each of the plurality of metered loads at each of the plurality of time instants;
   determining a secondary side voltage of the distribution transformer at each of the plurality of time instants based on the first current, the second current, the total current, and the respective meter voltages at the plurality of time instants; and
   determining the primary side voltage based on the secondary side voltage determined at a corresponding one of the plurality of time instants.

2. The method of claim 1, where the plurality of time instants is a first time instant, a second time instant, and a third time instant.

3. The method of claim 1, where determining the first current flowing through the secondary winding of the distribution transformer at the plurality of time instants comprises:
   measuring the current flowing through a first corresponding branch of each of the plurality of metered loads at the plurality of time instants; and
   summing the measured currents flowing through each of the first corresponding branches of the plurality of metered loads at each of the plurality of time instants.

4. The method of claim 3, where determining the second current flowing through the secondary winding of the distribution transformer at the plurality of time instants comprises:
   measuring the current flowing through a second corresponding branch of each of the plurality of metered loads at the plurality of time instants; and
   summing the measured currents flowing through each of the second corresponding branches of the plurality of metered loads at each of the plurality of time instants.

5. The method of claim 1, where receiving the respective meter voltage from each of the plurality of metered loads at each of the plurality of time instants comprises receiving the respective meter voltage from a first meter and a second meter at each of the plurality of time instants.

6. The method of claim 5 further comprising determining respective service line drop losses associated with the first meter and the second meter;
   wherein, determining the secondary side voltage of the distribution transformer at each of the plurality of time instants further includes determining the secondary side voltage of the distribution transformer at each of the plurality of time instants based on the respective service line drop losses.

7. The method of claim 1, further comprising determining a first common line loss and a second common line loss associated with secondary winding of the distribution transformer;
   wherein, determining the secondary side voltage of the distribution transformer at each of the plurality of time instants further includes determining the secondary side voltage of the distribution transformer at each of the plurality of time instants based on the first common line loss and the second common line loss.

8. A system to determine a primary side voltage of a distribution transformer comprising:
   a processor configured to:
   determine a first current flowing through a secondary winding of a distribution transformer at a plurality of time instants based on current meter data generated by a plurality of metered loads connected to a secondary side of the distribution transformer;
   determine a second current flowing through the secondary winding of the distribution transformer at the plurality of time instants based on the current meter data generated by the plurality of metered loads connected to the secondary side of the distribution transformer;
   determine a total current flowing to the plurality of metered loads for each of the plurality of time instants based on the first current at the plurality of time instants and the second current at the plurality of time instants;
   receive a respective meter voltage from each of the plurality of metered loads at each of the plurality of time instants;
   determine a secondary side voltage of the distribution transformer at each of the plurality of time instants based on the first current, the second current, the total current, and the respective meter voltages at the plurality of time instants; and
   determine the primary side voltage based on the secondary side voltage determined at a corresponding one of the plurality of time instants.

9. The system of claim 8, where the plurality of time instants is a first time instant, a second time instant, and a third time instant.

10. The system of claim 8, where the processor is further configured to:
    measure the current flowing through a first corresponding branch of each of the plurality of metered loads at the plurality of time instants; and
    sum the measured currents flowing through each of the first corresponding branches of the plurality of metered loads at each of the plurality of time instants to determine the first current flowing through the secondary winding of the distribution transformer at the plurality of time instants.

11. The system of claim 10, where the processor is further configured to:
    measure the current flowing through a second corresponding branch of each of the plurality of metered loads at the plurality of time instants; and
    sum the measured currents flowing through each of the second corresponding branches of the plurality of metered loads at each of the plurality of time instants to determine the second current flowing through the secondary winding of the distribution transformer at the plurality of time instants.

12. The system of claim 8, where the respective meter voltage from each of the plurality of metered loads at each of the plurality of time instants is a first meter voltage from a first meter and a second meter voltage from a second meter.

13. The system of claim 12, wherein the processor is further configured to:
    receive respective service line drop losses associated with the first meter and the second meter; and
    determine the secondary side voltage of the distribution transformer at each of the plurality of time instants based on the respective service line drop losses.

14. The system of claim 8, wherein the processor is further configured to:
    receive a first common line loss and a second common line loss associated with secondary winding of the distribution transformer; and
    determine the secondary side voltage of the distribution transformer at each of the plurality of time instants further based on the first common line loss and the second common line loss.

15. A non-transitory computer-readable medium encoded with computer executable instructions, the computer executable instructions executable with a processor, the computer-readable medium comprising:
    instructions executable to determine a first current flowing through a secondary winding of a distribution transformer at a plurality of time instants based on current meter data generated by a plurality of metered loads connected to a secondary side of the distribution transformer;
    instructions executable to determine a second current flowing through the secondary winding of a distribution transformer at the plurality of time instants based on the current meter data generated by the plurality of metered loads connected to the secondary side of the distribution transformer;
    instructions executable to determine a total current flowing to the plurality of metered loads for each of the plurality of time instants based on the first current at the plurality of time instants and the second current at the plurality of time instants;
    instructions executable to receive a respective meter voltage from each of the plurality of metered loads at each of the plurality of time instants;
    instructions executable to determine a secondary side voltage of the distribution transformer at each of the plurality of time instants based on the first current, the second current, the total current, and the respective meter voltages at the plurality of time instants; and
    instructions executable to determine a primary side voltage of the distribution transformer based on the secondary side voltage determined at a corresponding one of the plurality of time instants.

16. The computer-readable medium of claim 15, where the plurality of time instants is a first time instant, a second time instant, and a third time instant.

17. The computer-readable medium of claim 15 further comprising:

instructions executable to measure the current flowing through a first corresponding branch of each of the plurality of metered loads at the plurality of time instants; and instructions executable to sum the measured currents flowing through each of the first corresponding branches of the plurality of metered loads at each of the plurality of time instants to determine the first current flowing through the secondary winding at the plurality of time instants.

18. The computer-readable medium of claim 17 further comprising:

instructions executable to measure the current flowing through a second corresponding branch of each of the plurality of metered loads at the plurality of time instants; and instructions executable to sum the measured currents flowing through each of the second corresponding branches of the plurality of metered loads at each of the plurality of time instants to determine the second current flowing through the secondary winding at the plurality of time instants.

19. The computer-readable medium of claim 15 further comprising: instructions executable to receive a respective meter voltage from a first meter and a second meter at each of the plurality of time instants.

20. The computer-readable medium of claim 19 further comprising:

instructions executable to determine respective service line drop losses associated with the first meter and the second meter; and instructions executable to determine the secondary side voltage of the distribution transformer at each of the plurality of time instants based on the respective service line drop losses.

21. The computer-readable medium of claim 15 further comprising:

instructions executable to determine a first common line loss and a second common line loss associated with secondary winding of the distribution transformer; and instructions executable to determine the secondary side voltage of the distribution transformer at each of the plurality of time instants based on the first common line loss and the second common line loss.

* * * * *